(12) United States Patent (10) Patent No.: US 7,900,118 B2
Chang et al. (45) Date of Patent: Mar. 1, 2011

(54) FLASH MEMORY SYSTEM AND METHOD FOR CONTROLLING THE SAME

(75) Inventors: Yu-An Chang, Hsin-Chu Hsien (TW); Chee-Kong Awyong, Hsin-Chu Hsien (TW); Chin Ling Wang, Hsin-Chu Hsien (TW)

(73) Assignee: Phison Electronics Corp., Hsinchu (TW)

( * ) Notice: Subject to any disclaimer, the term of this patent is extended or adjusted under 35 U.S.C. 154(b) by 1053 days.

(21) Appl. No.: 11/704,986

(22) Filed: Feb. 12, 2007

(65) Prior Publication Data

US 2008/0195900 A1 Aug. 14, 2008

(51) Int. Cl.
*G11C 29/00* (2006.01)
(52) U.S. Cl. .................................................. 714/763
(58) Field of Classification Search ......... 714/763–764, 714/769–770
See application file for complete search history.

(56) References Cited

U.S. PATENT DOCUMENTS 6,769,087 B2 * 7/2004 Moro et al. ................. 714/763
7,322,002 B2 * 1/2008 Keays et al. ................. 714/763

FOREIGN PATENT DOCUMENTS

JP 2004152194 5/2004
WO WO 2006-013529 A1 2/2006

OTHER PUBLICATIONS

Office Action dated Jul. 15, 2010 issued in corresponding Chinese Patent Application No. 200710096882.6.

* cited by examiner

*Primary Examiner*—Shelly A Chase
(74) *Attorney, Agent, or Firm*—Bacon & Thomas, PLLC

(57) ABSTRACT

A flash memory system comprises a group of pages each consisting of a plurality of memory zones with various sizes; a read/write controller for controlling reading or writing of data from or to one of the pages; an error correction unit including at least two ECC (Error Correction Code) engines each encoding or decoding the data for performing error detection and correction; and an ECC judgment unit for selecting one of the ECC engines on the basis of predetermined conditions.

30 Claims, 7 Drawing Sheets

FLASH MEMORY SYSTEM AND METHOD FOR CONTROLLING THE SAME

FIELD OF THE INVENTION

The present invention relates to a flash memory, and more particularly, to a flash memory system and a method for controlling the same.

BACKGROUND OF THE INVENTION

During the last several decades, the issue of error correction and detection has great practical importance. Error detection and correction are the abilities to detect errors that are made due to scratches or other impairments in the course of the transmission from the transmitter to the receiver, meanwhile enable localization and correcting of the errors. An error correcting code (ECC) is therefore contributed to the above. ECC is used in computer data storage, for example flash memory and dynamic RAM, and in data transmission. Examples include Hamming code, Reed-Solomon code, Bose-Chaudhuri-Hocquengham (BCH) code, Reed-Muller code, Binary Golay code, convolutional code, and turbo code. The simplest error correcting codes can correct single-bit errors and detect double-bit errors. Other codes can detect or correct multi-bit errors. ECC provides greater data accuracy and system uptime by protecting against possible errors in computer memory.

FIG. 1 illustrates virtual to physical address translation in a flash file system according to the prior art. Physical address space 13 is composed of physical units 111 that are actually the erase blocks, i.e., the smallest chunks that can be erased. Each physical unit 111 contains one or more physical pages 113, where a page is the smallest chunk that can be written. A virtual address space 11 is composed of virtual units 121 that have the same size as the physical units. Each virtual unit contains one or more virtual pages 123, having the same size as physical pages 113. When a virtual address is provided by an application, for reading or writing, the virtual unit number to which that address belongs is extracted from the virtual address. As stated above, a physical page is a minimum unit for programming data-reading. In other words, the prior art is not able to process the size of the stored data less than that of a page, normally 512 bytes in conventional flash memory or 2048 bytes in NAND flash memory, and relatively influences the overall reliability and performance of the flash memory.

In addition, the time required for error correction is related to the length of error correction bits and that of data bits being processed during any error correcting cycle. In general, great efficiency is achieved by processing a longer bit length of ECCs in the erroneous area, i.e., where the errors occur the most, and vice versa. However, in previous memory management circuits, such as the flash memory system of U.S. Pat. No. 5,937,425, the overhead consumption of error correction was relatively high because the ECC bit length and page size are fixed by industry standard. To overcome the limitation of prior art, it is desirable to provide a flash memory system and a controlling method for better utilization of the capacity of a page and efficient allocation of ECCs.

SUMMARY OF THE INVENTION

Certain problems of previous devices have been recognized by the present invention. It has been recognized that previous error correction circuitry did not take advantage of increased efficiency and other benefits which have been found to be possible according to the present invention. It is an object of the present invention to provide a flash memory system for better utilization of the capacity of a page and allocation of ECCs.

In accordance with an aspect of the present invention, a flash memory system comprises a group of pages each consisting of a plurality of memory zones with various sizes, a read/write controller for controlling reading or writing of data from or to one of the pages, an error correction unit including at least two ECC (Error Correction Code) engines each encoding or decoding the data for performing error detection and correction, and an ECC judgment unit for selecting one of the ECC engines on the basis of predetermined conditions.

Preferably, the predetermined conditions comprise the memory zones to be used and characteristics of the data.

Preferably, the ECCs have various bit lengths.

Certainly, the ECCs have various coding algorithms.

Preferably, the coding algorithms comprise Hamming coding, Reed-Solomon coding, Bose-Chaudhuri-Hocquengham (BCH) code, Reed-Muller coding, Binary Golay coding, convolutional coding, and turbo coding.

Preferably, each of the pages contains 2048 bytes.

Preferably, each of the pages contains 512 bytes.

Preferably, the memory zones having high recurrences of errors employ ECCs of longer bit lengths.

Preferably, the flash memory system can be a USB Pen-Drive, a secure digital (SD) card, a multi-media card (MMC), and a flash drive.

It is another object of the present invention to provide a method for controlling a flash memory system having a group of pages.

In accordance with another aspect of the present invention, a method for controlling a flash memory system having a group of pages comprising the steps of: partitioning each page into a plurality of memory zones with various sizes; retrieving data; selecting one of predetermined ECCs on the basis of predetermined conditions; and storing the data and the ECC output (normally call it redundancy or parity check digits).

Preferably, the predetermined conditions comprise the memory zones to be used and characteristics of the data.

Preferably, the ECCs have various bit lengths.

Certainly, the ECCs have various coding algorithms.

Preferably, the coding algorithms comprise Hamming coding, Reed-Solomon coding, Bose-Chaudhuri-Hocquengham (BCH) code, Reed-Muller coding, Binary Golay coding, convolutional coding, and turbo coding.

Preferably, each of the pages contains 2048 bytes.

Preferably, each of the pages contains 512 bytes.

Preferably, the memory zones having high recurrences of errors employ ECCs of longer bit lengths.

Preferably, the flash memory system can be a USB Pen-Drive, a secure digital (SD) card, a multi-media card (MMC), and a flash drive.

In accordance with another aspect of the present invention, a method for controlling a flash memory system having a group of pages comprising the steps of: requesting access to data stored in memory zones; accessing the data through the flash memory system; selecting one of predetermined ECCs on the basis of predetermined conditions; correcting the data with the selected ECC; and outputting the data.

Preferably, the predetermined conditions comprise the memory zones to be used and characteristics of the data.

Preferably, the ECCs have various bit lengths.

Certainly, the ECCs have various coding algorithms.

Preferably, the coding algorithms comprise Hamming coding, Reed-Solomon coding, Bose-Chaudhuri-Hocquengham (BCH) code, Reed-Muller coding, Binary Golay coding, convolutional coding, and turbo coding.

Preferably, each of the pages contains 2048 bytes.

Preferably, each of the pages contains 512 bytes.

Preferably, the memory zones having high recurrences of errors employ ECCs of longer bit lengths.

Preferably, the flash memory system can be a USB Pen-Drive, a secure digital (SD) card, a multi-media card (MMC), and a flash drive.

In accordance with another aspect of the present invention, a flash memory system comprises a group of pages each consisting of a plurality of memory zones with an identical size, a read/write controller for controlling reading or writing of data from or to one of the pages, an error correction unit including at least two ECC (Error Correction Code) engines each encoding or decoding the data for performing error detection and correction, and an ECC judgment unit for selecting one of the ECC engines on the basis of predetermined conditions.

Preferably, the predetermined conditions comprise the memory zones to be used and characteristics of the data.

Preferably, the ECCs have various bit lengths.

Preferably, the ECCs have various coding algorithms.

Preferably, the coding algorithms comprise Hamming code, Reed-Solomon code, Bose-Chaudhuri-Hocquengham (BCH) code, Reed-Muller code, Binary Golay code, convolutional code, and turbo code.

Preferably, each of the pages contains 2048 bytes.

Preferably, each of the pages contains 512 bytes.

Preferably, the plurality of memory zones each has a capacity of n×512 bytes, where n is a natural number.

Preferably, the memory zones having high recurrences of errors employ ECCs of longer bit lengths.

Preferably, the flash memory system includes a USB Pen-Drive, a SD card, a MMC, and a flash drive.

In accordance with another aspect of the present invention, a method for controlling a flash memory system having a group of pages, comprises the steps of: partitioning each page into a plurality of memory zones with an identical size; retrieving data; selecting one of predetermined ECCs on the basis of predetermined conditions; and storing the data and the ECC output (normally call it redundancy or parity check digits).

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENTS

The present invention discloses a flash memory system and a controlling method for application in the same. The objects and advantages of the present invention will become more readily apparent to those ordinarily skilled in the art after reviewing the following detailed description. The present invention needs not be limited to the following embodiments.

Figure 1:
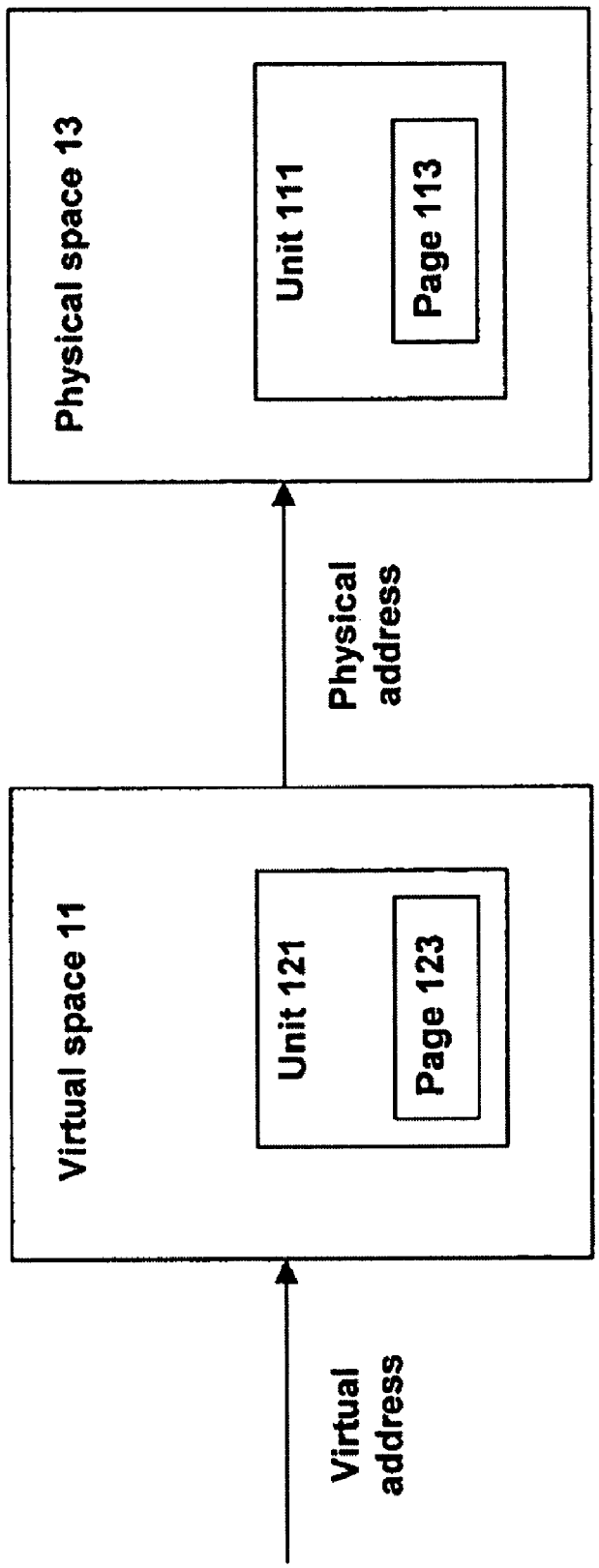
FIG. 1 is a schematic diagram of a physical address in a flash file system according to the prior art.
Figure 2:
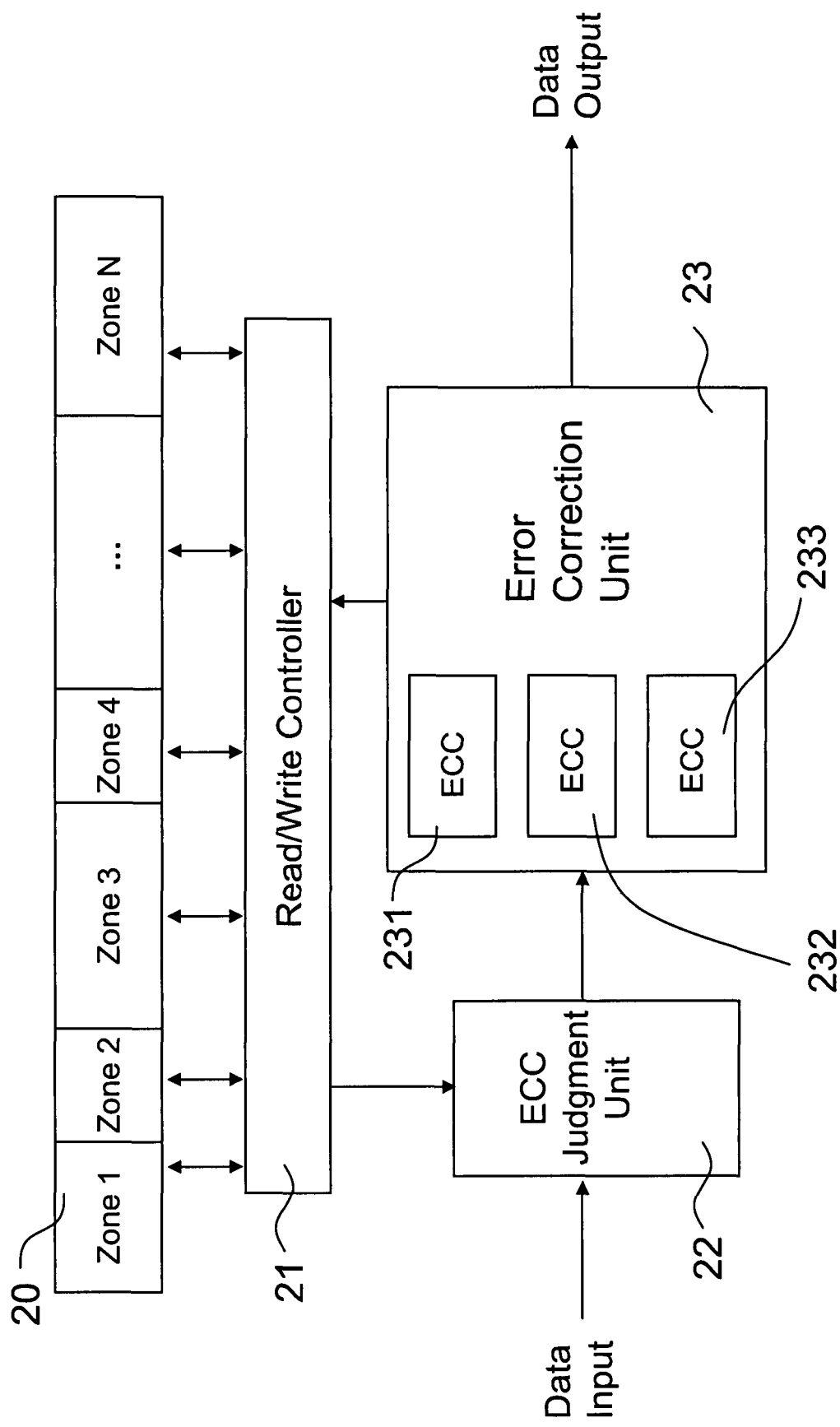
FIG. 2 illustrates an architecture of a flash memory system according to the present invention.

Please refer to FIG. 2. It illustrates a preferred architecture of a flash memory system according to the present invention. As shown in FIG. 2, a flash memory system encompasses a group of pages (only one page 20 is shown in this figure for exemplary purpose), a read/write controller 21 for controlling reading or writing of data from or to one of the pages during data transmission, an ECC judgment unit 22, and an error correction unit 23. The error correction unit 23 further comprises ECC engines 231, 232, and 233.

Figure 3:
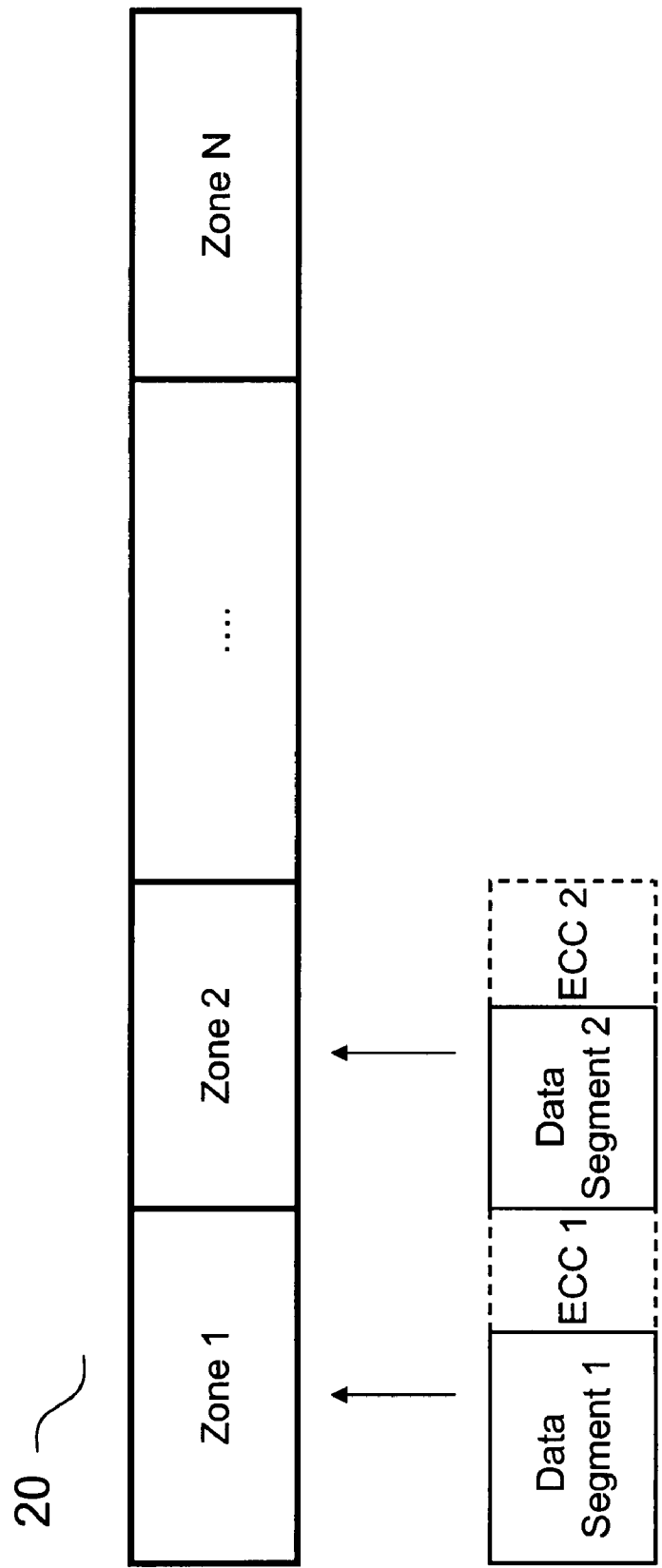
FIG. 3 is a schematic diagram of a page.

Each page contains a capacity of 2112 (2048 data fields+64 spare fields) bytes, and further consists of a plurality of memory zones with various sizes for storing data. The data to be stored is partitioned into several segments to fit in their respective memory zones. Alternate embodiments may use different, larger or smaller capacity of a page in a flash memory system. The memory zones are accorded zone numbers respectively, for easy locating, as shown in the page 20 of FIG. 2. Each memory zone can be stored with a data segment followed by an ECC, i.e., the redundant information that describes the bit sequence in the data segment, as shown in FIG. 3. Alternatively, the ECCs for their respective data segments can be placed in a lump sum at the redundant portion of the end of each page. According to the selection of ECC judgment unit 22 based on the predetermined conditions, such as which memory zones to be used or characteristics of the data, the input data will be encoded and generated redundancy by ECC engines 231, 232 or 233 of the error correction unit 23. The employed ECCs can have different bits lengths, and are served to add extra information to the data segment in a fashion that allows corrections to be made to the data segments if there are errors detected. Additionally, the ECC engines 231, 232 and 233 adopt a number of coding algorithms, such as Hamming coding, Reed-Solomon coding, Bose-Chaudhuri-Hocquengham (BCH) coding, Reed-Muller coding, Binary Golay coding, convolutional coding, turbo coding and the like. The error correction unit 23 is dedicated to encoding or decoding the data with the ECC selected by means of the ECC judgment unit 22.

Figure 4:
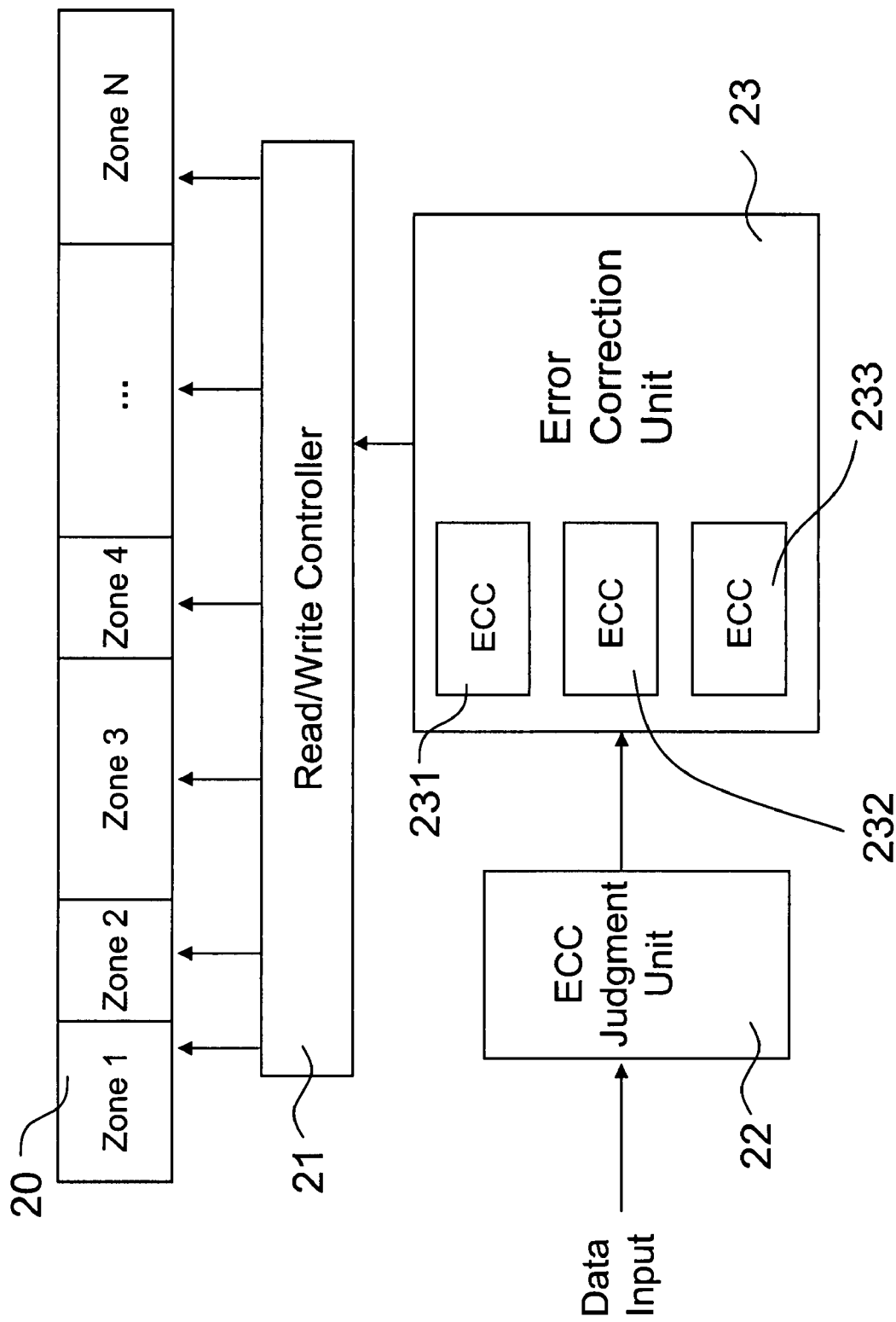
FIG. 4 is a schematic diagram of a data input path according to the present invention.
Figure 5:
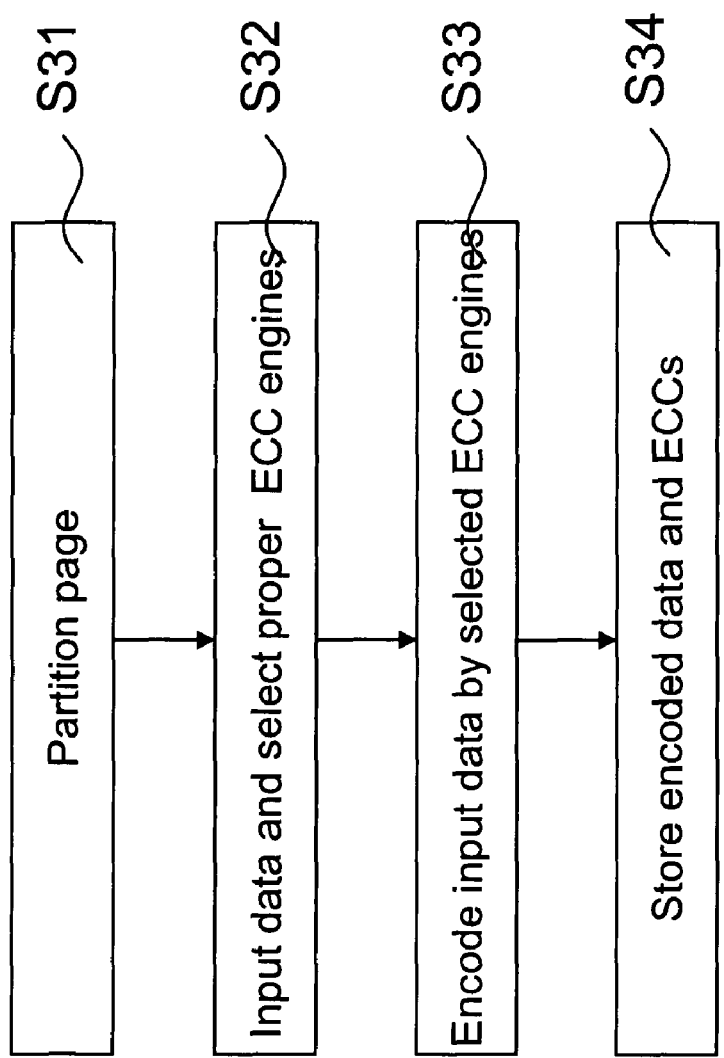
FIG. 5 illustrates steps of a method for data input according to the present invention.

Please refer to FIG. 4 and FIG. 5. They illustrate steps of a method for controlling data input according to the present invention. Prior to writing the data into pages during the error correcting cycle, step S31 is first taken. A page 20 of a capacity of 2112 bytes is partitioned into a plurality of memory zones with various sizes. In this embodiment, there are eight memory zones, zone 1, zone 2, zone 3, . . . , and zone 8, and alternate embodiments may partition additional memory zones to perform the operation. The capacities of each partitioned zones are 522 bytes, 8 bytes, 522 bytes, 4 bytes, 522 bytes, 4 bytes, 522 bytes, and 8 bytes, respectively. The data inputted is partitioned as well in accordance with the sizes of each memory zone. The data to be written is transmitted to the ECC judgment unit 22 for selecting appropriate ECC engines among ECC engines 231, 232, and 233 of the error correction unit 23 at step S32 of FIG. 4. Based on the memory zones to be occupied and the data characteristics, the Reed-Solomon (RS) coding and Bose-Chaudhuri-Hocquengham (BCH) coding are selected for data encoding in this embodiment. One of the ECC engines 231, 232 and 233 of the error correction unit 23 is signaled to generate eight different encoded data segments with their respective redundancies at step S33.

Each ECC engine utilizes a distinctive coding algorithm to scramble and encode the data segments into redundant forms. More particularly, coding algorithms are capable of working at the bit or symbol level depending on the errors' placement. Accordingly, the data partitioned into eight segments falling into their corresponding memory zones are encoded by RS coding, BCH coding, RS coding, BCH coding, RS coding, BCH coding, RS coding, and BCH coding, and their corresponding ECCs are as follows: 4 symbols, 4 bits, 4 symbols, 5 bits, 4 symbols, 5 bits, 4 symbols, and 4 bits, respectively. At step S34, the algorithm-based redundant information (ECC) is recorded along with the data segments themselves through the read/write controller 21, and added simultaneously to the redundant portion of the predefined memory zones, where the ECCs contain effective redundant information to be decoded to detect and correct errors that may arise due to data transmission.

Figure 6:
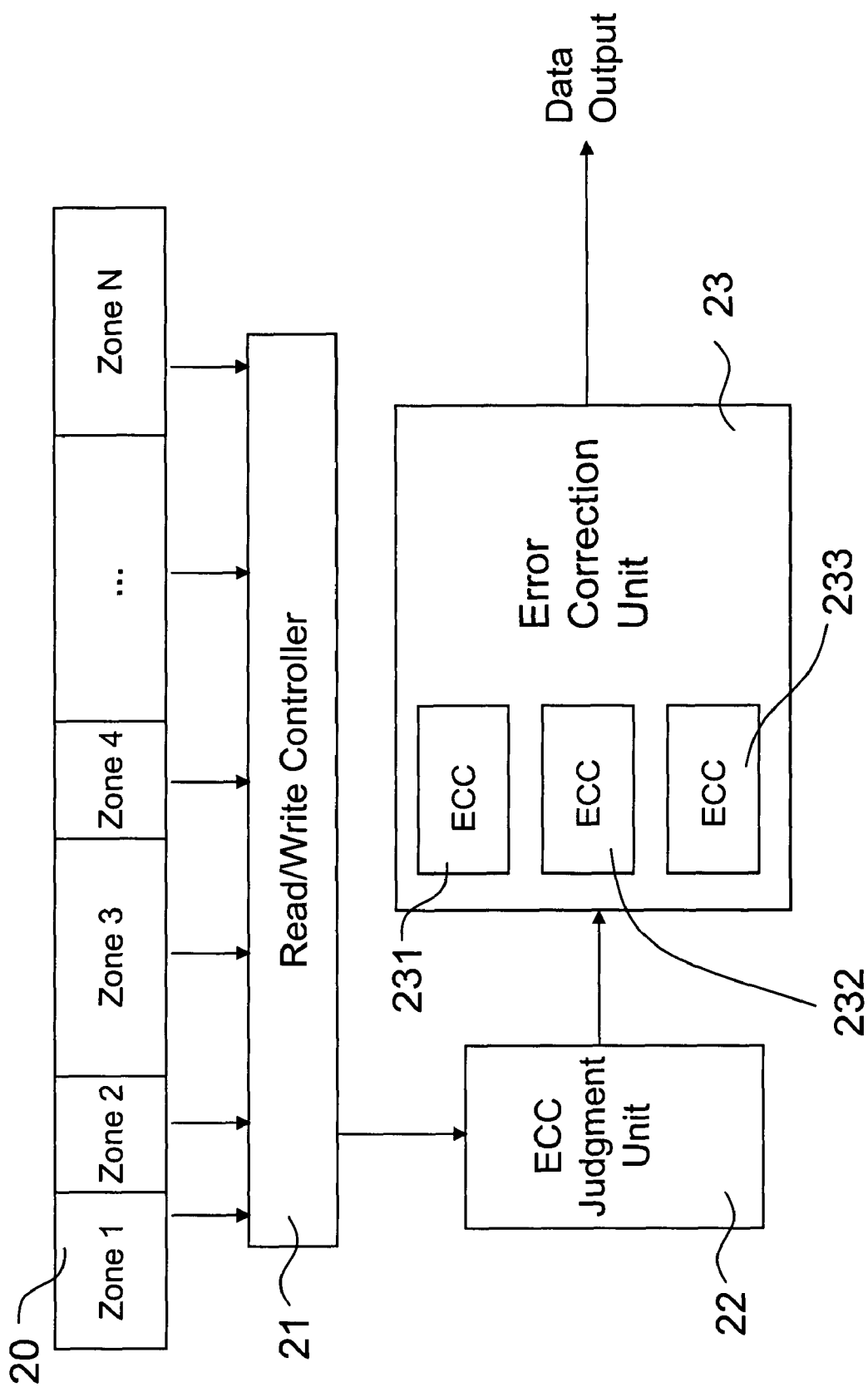
FIG. 6 is a schematic diagram of a data output path according to the present invention.
Figure 7:
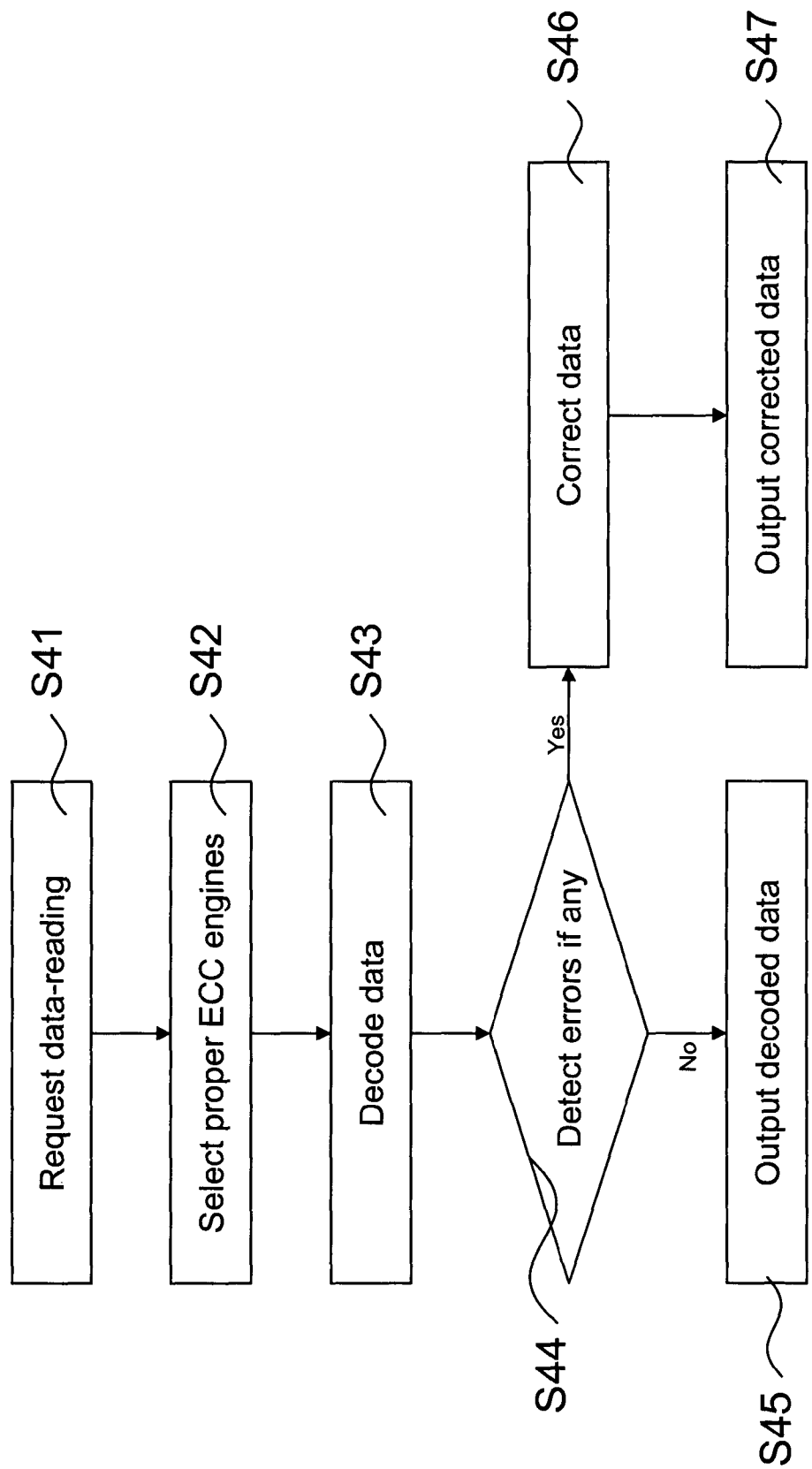
FIG. 7 illustrates steps of a method for data output according to the present invention.

Please refer to FIG. 6 and FIG. 7. They illustrate steps of a method for controlling data output according to the present invention. When the stored data is requested for reading out, as shown at step S41 of FIG. 7, the data segments along with the ECCs are retrieved from memory zones of page 20 and transmitted through the read/write controller 21 to the ECC judgment unit 22, as illustrated in FIG. 6. At step S42 of FIG. 7, likewise, the ECC judgment unit 22 determines which ECC engines were used according to the redundant information. Based on the selection of the ECC judgment unit 22, the generated ECCs for the stored data and the data segments are again calculated and decoded using the original algorithms, i.e. the RS coding and the BCH coding, as shown at step S43 of FIG. 7. Following is step S44, the error correction unit 23 contributes to functions of detecting presence or absence of an error and performing proper correction for the stored data segments of the page 20, provided that an error is detected and the error is correctable. If no error is detected by means of the decoded ECCs, the data is free of errors and will be read out, as illustrated at step S45 of FIG. 7. Otherwise, the missing or erroneous bits are determined through the decoded ECCs and the bit or bits are supplied or corrected by means of the given algorithms at step S46, and the corrected data at the last step S47 of FIG. 7 will be outputted.

The properties of the present invention make it especially well-suited to applications of a USB PenDrive, a SD card, a MMC, and a flash drive. Alternatively, each page can be partitioned into several memory zones of an identical size, and each zone has a capacity of n×512 bytes, where n is a natural number. Certainly, alternate embodiments may adopt a diversity of coding algorithms or ECCs of longer bit lengths to perform the error correcting operation in a page. In other words, to achieve efficient utilization and allocation of ECCs, longer bit lengths or better correction capabilities of ECCs can be employed and allotted subject to the predetermined conditions, such as the memory zones where stand a great deal of error occurrences, or the data to be stored of great importance tolerating zero bit errors.

In conclusion, the present invention provides a flash memory system and a controlling method for application in the same. The flash memory system encompasses a plurality of pages partitioned into several memory zones with various capacities, and the method controls the flash memory system using multiple ECCs in one page as well as applying a longer bit length of ECC in an erroneous area, i.e., where errors occur the most, and vice versa. Differentiated from the conventional flash memory management system, the present invention is provided with an ECC judgment unit to select appropriate ECCs based on memory zones to be used and the characteristics of data. The present flash memory system further incorporates at least two ECC engines for carrying out efficient utilization of the ECCs. In light of the ECC bit lengths and page size fixed by industry standard, the present invention successfully overcome the limitation of prior art by providing a flash memory system and a controlling method for better utilization of the capacity of a page, efficient allocation of ECCs, and great integration for the entire flash memory system.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A flash memory system, comprising:
    a group of pages each consisting of a plurality of memory zones with various sizes;
    a read/write controller for controlling reading or writing of data from or to one of the pages;
    an error correction unit including at least two ECC (Error Correction Code) engines each encoding or decoding the data for performing error detection and correction, wherein the ECCs have various bit lengths; and
    an ECC judgment unit for selecting one of the ECC engines on the basis of predetermined conditions.

2. The flash memory system according to claim 1, wherein the predetermined conditions comprise the memory zones to be used and characteristics of the data.

3. The flash memory system according to claim 1, wherein the ECCs have various coding algorithms.

4. The flash memory system according to claim 3, wherein the coding algorithms comprise Hamming code, Reed-Solomon code, Bose-Chaudhuri-Hocquengham (BCH) code, Reed-Muller code, Binary Golay code, convolutional code, and turbo code.

5. The flash memory system according to claim 1, wherein each of the pages contains 2048 bytes or 512 bytes.

6. The flash memory system according to claim 1, wherein the memory zones having high recurrences of errors employ ECCs of longer bit lengths.

7. The flash memory system according to claim 1, wherein the flash memory system comprises a USB PenDrive, a secure digital (SD) card, a multi-media card (MMC), and a flash drive.

8. A method for controlling a flash memory system having a group of pages, comprising the steps of:
    partitioning each page into a plurality of memory zones with various sizes;
    retrieving data;
    selecting one of predetermined ECCs on the basis of predetermined conditions, wherein the ECCs have different bit lengths; and
    storing the data and the ECC output.

9. The method according to claim 8, wherein the predetermined conditions comprise the memory zones to be used and characteristics of the data.

10. The method according to claim 8, wherein the predetermined ECCs have different coding algorithms.

11. The method according to claim 10, wherein the coding algorithms comprise Hamming code, Reed-Solomon code, Bose-Chaudhuri-Hocquengham (BCH) code, Reed-Muller code, Binary Golay code, convolutional code, and turbo code.

12. The method according to claim 8, wherein each of the pages contains 2048 bytes or 512 bytes.

13. The method according to claim 8, wherein the memory zones having high recurrences of errors employ ECCs of longer bit lengths.

14. The method according to claim 8, wherein the flash memory system comprises a USB PenDrive, a SD card, a MMC, and a flash drive.

15. A method for controlling a flash memory system having a group of pages, comprising the steps of:
   requesting access to data stored in memory zones;
   accessing the data through the flash memory system;
   selecting one of predetermined ECCs on the basis of predetermined conditions, wherein the ECCs have different coding algorithms;
   correcting the data with the selected ECC; and
   outputting the data.

16. The method according to claim 15, wherein the predetermined conditions comprise the memory zones to be used and characteristics of the data.

17. The method according to claim 15, wherein the ECCs have different bit lengths.

18. The method according to claim 15, wherein the coding algorithms comprise Hamming code, Reed-Solomon code, Bose-Chaudhuri-Hocquengham (BCH) code, Reed-Muller code, Binary Golay code, convolutional code, mid turbo code.

19. The method according to claim 15, wherein each of the pages contains 2048 bytes or 512 bytes.

20. The method according to claim 15, wherein the memory zones having high recurrences of errors employ ECCs of longer bit lengths.

21. The method according to claim 15, wherein the flash memory system comprises a USB PenDrive, a SD card, a MMC, and a flash drive.

22. A flash memory system, comprising:
   a group of pages each consisting of a plurality of memory zones with an identical size;
   a read/write controller for controlling reading or writing of data from or to one of the pages;
   an error correction unit including at least two ECC (Error Correction Code) engines each encoding or decoding the data for performing error detection and correction, wherein the ECCs have various coding algorithms; and
   an ECC judgment unit for selecting one of the ECC engines on the basis of predetermined conditions.

23. The flash memory system according to claim 22, wherein the predetermined conditions comprise the memory zones to be used and characteristics of the data.

24. The flash memory system according to claim 22, wherein the ECCs have various bit lengths.

25. The method according to claim 22, wherein the coding algorithms comprise Hamming code, Reed-Solomon code, Bose-Chaudhuri-Hocquengham (BCH) code, Reed-Muller code, Binary Golay code, convolutional code, mid turbo code.

26. The flash memory system according to claim 22, wherein each of the pages contains 2048 bytes or 512 bytes.

27. The flash memory system according to claim 22, wherein the plurality of memory zones each has a capacity of n×512 bytes, where n is a natural number.

28. The flash memory system according to claim 22, wherein the memory zones having high recurrences of errors employ ECCs of longer bit lengths.

29. The flash memory system according to claim 22, wherein the flash memory system comprises a USB PenDrive, a secure digital (SD) card, a multi-media card (MMC), and a flash drive.

30. A method for controlling a flash memory system having a group of pages, comprising the steps of:
   partitioning each page into a plurality of memory zones with an identical size;
   retrieving data;
   selecting one of predetermined ECCs on the basis of predetermined conditions, wherein the ECCs have various coding algorithms; and
   storing the data and the ECC output.

* * * * *